US010404422B2

(12) United States Patent
Barich (10) Patent No.: US 10,404,422 B2
(45) Date of Patent: Sep. 3, 2019

(54) MEASURING AMPLITUDE AND PHASE RESPONSE OF MEASUREMENT INSTRUMENT WITH BINARY PHASE SHIFT KEYING TEST SIGNAL

(71) Applicant: Keysight Technologies, Inc., Santa Rosa, CA (US)

(72) Inventor: Edward M. Barich, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 584 days.

(21) Appl. No.: 15/144,757

(22) Filed: May 2, 2016

(65) Prior Publication Data

US 2017/0317792 A1    Nov. 2, 2017

(51) Int. Cl.
| H04L 1/24 | (2006.01) |
| H04L 27/20 | (2006.01) |
| G01R 23/16 | (2006.01) |
| H04B 17/12 | (2015.01) |
| H04L 27/233 | (2006.01) |

(52) U.S. Cl.
CPC .............. *H04L 1/244* (2013.01); *G01R 23/16* (2013.01); *H04B 17/12* (2015.01); *H04L 1/248* (2013.01); *H04L 27/2003* (2013.01); *H04L 27/2338* (2013.01)

(58) Field of Classification Search
CPC ....................................................... H04L 1/244

USPC .......................................................... 702/89
See application file for complete search history.

(56) References Cited

U.S. PATENT DOCUMENTS

| 5,581,190 A | 12/1996 | Herring et al. | |
| 8,411,788 B2 | 4/2013 | Sahota | |
| 8,605,850 B2 | 12/2013 | Anderson et al. | |
| 8,860,522 B2 | 10/2014 | Olsson | |
| 8,891,639 B2 | 11/2014 | Vanden Bossche | |
| 2003/0161411 A1* | 8/2003 | McCorkle | G01S 7/023 375/295 |
| 2010/0008399 A1* | 1/2010 | Lachartre | G06F 1/0321 375/130 |
| 2010/0034250 A1* | 2/2010 | O'Leary | H04L 27/0014 375/229 |

* cited by examiner

*Primary Examiner* — Ricky Ngon (57) ABSTRACT

A system and method employ an exclusive-OR gate having a first input configured to receive an RF carrier signal having an RF carrier, and a second input configured to receive a square wave signal having a square wave frequency, to output to a signal processing channel under test a binary phase shift keying (BPSK) signal comprising the RF carrier signal modulated by the square wave signal. A digital signal processor is configured to receive from the signal processing channel in-phase (I) and quadrature-phase (Q) data produced by the signal processing channel in response to the BPSK signal, and to process the I and Q data to determine an amplitude response and phase response of the signal processing channel as a function of frequency.

19 Claims, 8 Drawing Sheets

MEASURING AMPLITUDE AND PHASE RESPONSE OF MEASUREMENT INSTRUMENT WITH BINARY PHASE SHIFT KEYING TEST SIGNAL

BACKGROUND

Measurement instruments are used to test and analyze signals from electrical and electronic devices and systems. Examples of such measurement instruments include spectrum analyzers and vector signal analyzers which may be employed to characterize the frequency and/or phase responses of signals in the RF, microwave and/or millimeter wave frequency spectra.

Calibration is an important characteristic of such measurement instruments. That is, when using such a measurement instrument to make measure a characteristic (e.g., frequency response) of a signal (e.g., an output signal of a device under test (DUT)), it is important to know the amplitude and phase response of the measurement channel of the measurement instrument. In some cases, it may be sufficient to know that the measurement channel is operating within the specified parameters of the measurement instrument—for example that the amplitude and phase response as a function of frequency are within certain specified ranges or tolerances across a specified frequency span or range. In other cases, it may be desired to know the current operating parameters of the measurement instrument—for example the amplitude and phase response as a function of frequency across a specified frequency span or range—so that any deviations from an ideal characteristic in the measurement channel may be compensated when making signal measurements.

In particular, several techniques have been employed for characterizing the amplitude and phase linearity as a function of frequency of a signal processing channel of a wide bandwidth spectrum analyzer operating in the zero-span, digitizing (non-swept) mode.

In one known technique, a baseband square-wave reference signal is routed to the RF input of the analyzer, the analyzer is tuned to 0 Hz center frequency, and the in-phase/quadrature-phase (I/Q) waveform is captured by an intermediate frequency (IF) digitizer internal to the analyzer. By post-processing the I/Q record, the phase and amplitude channel response of the analyzer's IF channel can be measured and, if desired, used for flatness compensation. However, there are some disadvantages or limitations to this technique. First, the technique only makes measurements with the analyzer set to its low-band IF path. However, the analyzer may have multiple IF paths. So this technique can only measure the lowest-frequency heterodyne mixing band of the analyzer. Second, the measurement captures only phase and amplitude frequency response at a single RF frequency (0 Hz).

Another known technique involves routing a carrier wave (CW) signal to the RF input of the analyzer, tuning the analyzer to the CW center frequency, and sweeping the analyzer's local oscillator (LO) linearly across a frequency span of interest. The sweep of the LO signal causes the CW signal in turn to be swept across the IF bandwidth, and this sweep may be captured by the analyzer's IF digitizer, and the resulting I/Q record can be post-processed to calculate the phase and amplitude channel response of the analyzer's IF channel. However, there are also some disadvantages or limitations to this technique. First, this technique requires exact time alignment between the LO sweep and digitizer I/Q capture. This alignment is also subject to phase errors due to any non-linearity of the LO sweep. Also, in the normal "use" of the analyzer making a wideband frequency measurement of a signal (e.g., an output signal of a DUT), the LO is at a fixed frequency while the digitizer captures the IF signal across the IF channel. However since the LO is not fixed but is swept during the channel measurement procedure, frequency response errors are introduced into the channel measurement due to variations in the LO frequency.

Still another known technique employs an impulse generator, such as the KEYSIGHT® U9391 Comb Generator which may be driven by an RF reference signal (typically 10 MHz) to create a comb signal having a spectrum of equally-spaced tones with known phase and amplitude characteristics. This comb signal routed to the RF input of the analyzer, the analyzer is tuned to the desired center frequency in zero-span mode, and the I/Q waveform is captured by an internal IF digitizer of the analyzer. By post-processing the I/Q record, the phase and amplitude channel response of the analyzer's IF can be measured. However, there are also some disadvantages or limitations to this technique. First, as the analyzer center frequency increases, the power levels of the comb harmonics decrease greatly. The low signal-to-noise ratio of the measured signal degrades the repeatability of the measurement. Second, signal amplification to increase the power level of the comb signal's higher frequency harmonics causes the comb generator to consume more power. For example, the U9391G Comb Generator uses 13 watts to generate −85 dBm tones at 67 GHz.

It would be desirable to provide another technique for characterizing the amplitude and phase linearity as a function of frequency of a signal processing channel, for example a signal processing channel (e.g., an IF channel) of a spectrum analyzer or vector signal analyzer which may avoid some or all of the disadvantages or limitations of existing techniques.

SUMMARY

According to one aspect of the invention, a method comprises: providing an RF carrier signal having an RF carrier frequency to a first input of an exclusive-OR gate; applying a square wave signal having a square wave frequency to a second input of the exclusive-OR gate; outputting from the exclusive-OR gate a binary phase shift keying (BPSK) signal comprising the RF carrier signal modulated by the square wave signal; applying the BPSK signal to an RF input of a measurement instrument and passing the BPSK signal through a measurement channel of the measurement instrument; determining in the measurement instrument in-phase (I) and quadrature-phase (Q) time records of the BPSK signal output by the measurement channel of the measurement instrument; taking derivatives of the I and Q time records; finding a highest impulse response in the I and Q time records, and circularly rotating the I and Q time records so that the highest impulse response occurs at time zero; taking a Fast Fourier Transform (FFT) of the circularly rotated I and Q time records, retaining only FFT data at frequencies and harmonics of the square wave frequency; correcting amplitudes of the FFT data for a frequency characteristic of the square wave signal to obtain an amplitude response of the measurement channel of the measurement instrument; unwrapping a phase response of the amplitude-corrected FFT data across a measured frequency span; taking a derivative of the unwrapped phase response of the amplitude-corrected FFT data and removing any residual group delay offset to obtain a group delay response of the measurement channel of the measurement instrument; and integrating the group delay response to obtain a phase response of the measurement channel of the measurement instrument.

In some embodiments, the method further comprises: offsetting a center frequency of the measurement channel of the measurement instrument by a fraction of the square wave frequency, wherein the fraction is greater than zero and less than one; and frequency rotating the I and Q time records by an opposite of the fraction of the square wave frequency prior to taking the derivatives of the I and Q time records.

In some versions of these embodiments, the fraction of the square wave frequency is one quarter of the square wave frequency.

In some embodiments, the method further comprises: displaying on a display device at least one of: the amplitude response of the measurement channel of the measurement instrument, the group delay response of the measurement channel of the measurement instrument, and the phase response of the measurement channel of the measurement instrument.

In some embodiments, the method further comprises: displaying on a display device the amplitude response of the measurement channel of the measurement instrument, the group delay response of the measurement channel of the measurement instrument, and the phase response of the measurement channel of the measurement instrument.

In some embodiments, the RF carrier signal and square wave signal are provided to the exclusive-OR gate, and the exclusive-OR gate modulates the RF carrier signal with the square wave signal, internally to the measurement instrument.

In some versions of these embodiments, the measurement instrument is a vector signal analyzer.

In some embodiments, passing the BPSK signal through the measurement channel of the measurement instrument includes: downconverting the BPSK signal to an intermediate frequency (IF) channel; and digitizing the IF channel to produce the I and Q time records.

According to another aspect of the invention, a system comprises: an exclusive-OR gate having: a first input configured to receive an RF carrier signal having an RF carrier frequency, a second input configured to receive a square wave signal having a square wave frequency, and an output configured to output a binary phase shift keying (BPSK) signal comprising the RF carrier signal modulated by the square wave signal; a measurement channel having an input and an output, wherein the input is connected to receive the BPSK signal, and wherein the measurement channel is configured to provide at the output in-phase (I) and quadrature-phase (Q) time records of the BPSK signal; an acquisition memory configured to receive and to store therein the I and Q time records; and a digital signal processor. The digital signal processor is configured to: take derivatives of the I and Q time records; find a highest impulse response in the I and Q time records, and circularly rotate the I and Q time records so that the highest impulse response occurs at time zero; take a Fast Fourier Transform of the circularly rotated I and Q time records, retaining only FFT data at frequencies and harmonics of the square wave frequency; correct amplitudes of the FFT data for a frequency characteristic of the square wave signal to obtain an amplitude response of the measurement channel of the measurement instrument; unwrap a phase response of the amplitude-corrected FFT data across a measured frequency span; take a derivative of the unwrapped phase response of the amplitude-corrected FFT data and removing any residual group delay offset to obtain a group delay response of the measurement channel of the measurement instrument; and integrate the group delay response to obtain a phase response of the measurement channel.

In some embodiments, the digital signal processor includes a digital microprocessor and memory having stored therein instructions to cause the microprocessor to process the I and Q time records to obtain the phase response of the measurement channel.

In some embodiments, the digital signal processor is further configured to: offset a center frequency of the measurement channel by a fraction of the square wave frequency, wherein the fraction is greater than zero and less than one; and frequency rotate the I and Q time records by an opposite of the fraction of the square wave frequency prior to taking the derivatives of the I and Q time records.

In some versions of these embodiments, the fraction of the square wave frequency is one quarter of the square wave frequency.

In some embodiments, the system further comprises a display device configured to display at least one of: the amplitude response of the measurement channel of the measurement instrument, the group delay response of the measurement channel of the measurement instrument, and the phase response of the measurement channel of the measurement instrument.

In some embodiments, the system further comprises a display device configured to display the amplitude response of the measurement channel of the measurement instrument, the group delay response of the measurement channel of the measurement instrument, and the phase response of the measurement channel of the measurement instrument.

In some embodiments, the system further comprises a vector signal analyzer.

In some embodiments, the measurement channel includes: a downconverter configured to downconvert the BPSK signal to an intermediate frequency (IF) channel; and a digitizer configured to digitize the IF channel to produce the I and Q time records.

According to yet another aspect of the invention, a system comprises: an exclusive-OR gate having: a first input configured to receive an RF carrier signal having an RF carrier, a second input configured to receive a square wave signal having a square wave frequency, and an output configured to output to a signal processing channel under test a binary phase shift keying (BPSK) signal comprising the RF carrier signal modulated by the square wave signal; and a digital signal processor configured to receive from the signal processing channel in-phase (I) and quadrature-phase (Q) data produced by the signal processing channel in response to the BPSK signal, and to process the I and Q data to determine an amplitude response and phase response of the signal processing channel as a function of frequency.

In some embodiments, the digital signal processor is configured to process the I and Q data by: taking derivatives of the I and Q data as a function of time; finding a highest impulse response in the I and Q data, and circularly rotate the I and Q data so that the highest impulse response occurs at time zero; taking a Fourier Transform of the circularly rotated I and Q time records to produce frequency domain data, retaining only frequency domain data at frequencies and harmonics of the square wave frequency; correcting amplitudes of the frequency domain data for a frequency characteristic of the square wave signal to obtain an amplitude response of the signal processing channel; unwrapping a phase response of the amplitude-corrected frequency data across a measured frequency span; taking a derivative of the unwrapped phase response of the amplitude-corrected frequency domain data and removing any residual group delay offset to obtain a group delay response of the signal processing channel; and integrating the group delay response to obtain a phase response of the signal processing channel.

In some embodiments, the digital signal processor is further configured to: offset a center frequency of the measurement channel by a quarter of the square wave frequency; and frequency rotate the I and Q time records by an opposite of the quarter of the square wave frequency prior to taking the derivatives of the I and Q time records.

In some embodiments, the system further comprises a display device configured to display at least one of: the amplitude response of the measurement channel of the measurement instrument, the group delay response of the measurement channel of the measurement instrument, and the phase response of the measurement channel of the measurement instrument.

BRIEF DESCRIPTION OF THE DRAWINGS

The example embodiments are best understood from the following detailed description when read with the accompanying drawing figures. Wherever applicable and practical, like reference numerals refer to like elements.

FIG. 7A illustrates repeatability of amplitude linearity measurements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 1:
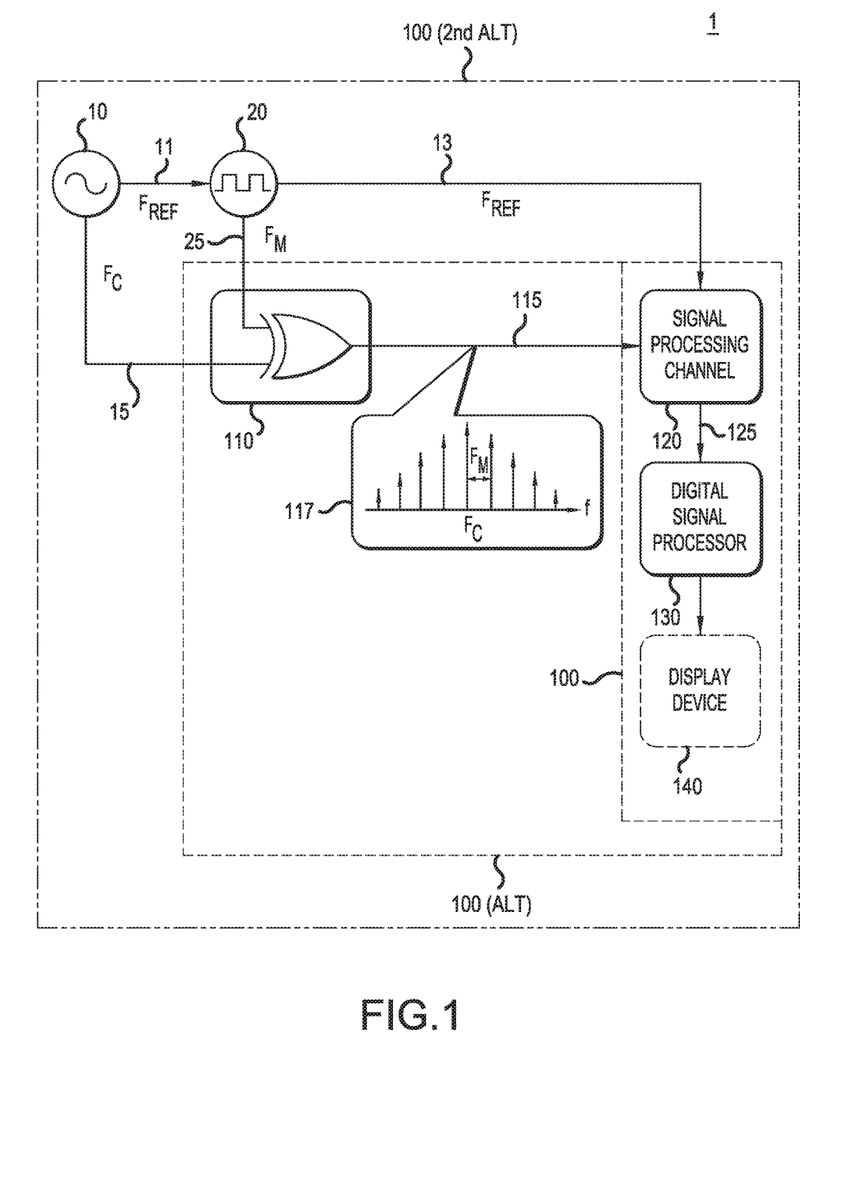
FIG. 1 is a simplified functional block diagram of one embodiment of an arrangement for measuring the amplitude and phase response of a signal processing channel of a measurement instrument.

FIG. 1 is a simplified functional block diagram of one embodiment of an arrangement 1 for measuring the amplitude and phase response of a signal processing channel 120 of a measurement instrument 100, which may also sometimes be referred to as a test instrument. The arrangement 1 includes: a radio frequency (RF) signal generator 10, a square wave signal generator 20, and an exclusive OR (XOR) gate 110.

RF signal generator 10 generates an RF carrier signal 15 having an RF carrier frequency $F_C$ and supplies RF carrier signal 15 to a first input of XOR gate 110. In some embodiments, the RF carrier frequency $F_C$ may be greater than 1 GHz. In some embodiments, the RF carrier frequency $F_C$ may be greater than 10 GHz.

Square wave signal generator 20 generates a square wave signal 25 having a square wave frequency $F_M$ and supplies square wave signal 25 to a second input of XOR gate 110. In some embodiments, the RF carrier frequency $F_M$ may have a frequency in a range of several MHz, for example 2.5 MHz. In some embodiments where measurement instrument 100 is a spectrum analyzer having a user-selected displayed frequency span, the RF carrier frequency $F_C$ may be selected depending on the user-selected frequency span of the spectrum analyzer.

RF signal generator 10 also may supply a reference frequency signal 11 to square wave signal generator 20, and square wave signal generator 20 may supply a reference frequency signal 13 to measurement instrument 100. Beneficially, reference frequency signal 13 may be the same as reference frequency signal 11 or may be synchronized to reference frequency signal 13. In some embodiments, reference frequency signal 11 and reference frequency signal 13 may each be 10 MHz sine wave signals. In other embodiments, instead of square wave signal generator 20 supplying a reference frequency signal 13 to measurement instrument 100, RF signal generator 10 may supply reference frequency signal 11 to both square wave signal generator 20 and measurement instrument 100. In still other embodiments, instead of receiving reference frequency signal 11 from RF signal generator 10, square wave signal generator 20 may supply reference frequency signal 13 to both RF signal generator 10 and measurement instrument 100. Regardless of how it is accomplished, one or more reference frequency signals may allow RF signal generator 10, square wave signal generator 20, and measurement instrument 100 to synchronize their frequency sources (e.g., internal oscillators) to each other.

In general, measurement instrument 100 may be any instrument which measures one or more electrical parameters of a signal or device under test (DUT). Measurement instrument 100 includes a digital signal processor 130 and may include a display device 140. In some embodiments, measurement instrument 100 may be a spectrum analyzer or a vector signal analyzer. Signal processing channel 120 may be a measurement channel of measurement instrument 100 and arrangement 1 may allow the amplitude and phase linearity of the measurement channel to be measured as a function of frequency. In some cases, this may allow a user to confirm that that the measurement channel is operating within the specified parameters of measurement instrument 100. In other cases, this may allow measurement instrument 100 to compensate for any deviations in the amplitude and phase response of the measurement channel (i.e., signal processing channel 120) as a function of frequency across a specified frequency span or range when measuring a received signal, for example a signal received from a DUT.

Although FIG. 1 illustrates a beneficial arrangement 1 where signal processing channel 120 is a measurement channel of measurement instrument 100, other arrangements may employ RF signal generator 10, square wave signal generator 20, XOR gate 110 and digital signal processor to measure the amplitude and phase linearity of a signal processing channel which is included in a different system or apparatus other than a measurement instrument.

As illustrated by the dashed lines in FIG. 1, in some embodiments exclusive OR (XOR) gate 110 may be external to measurement instrument 100, and in other alternative embodiments the measurement instrument 100 (Alt.) may include XOR gate 110. Also, in some embodiments RF signal generator 10 and square wave signal generator 20 may be external to measurement instrument 100, and in other alternative embodiments the measurement instrument 100 ($2^{nd}$ Alt.) may include RF signal generator 10 and/or square wave signal generator 20.

XOR gate 110 operates as a binary phase-shift keyed (BPSK) modulator, modulating RF carrier signal 15 with square wave signal 25 to produce a BPSK signal 115. BPSK signal 115 is supplied from XOR gate 110 (perhaps through one or more amplifiers, buffers, inverters, etc.) to an input (i.e., via an RF input connector) of measurement instrument 100, and BPSK signal 115 passes through signal processing channel 120 of measurement instrument 100. FIG. 1 shows an example frequency spectrum 117 of BPSK signal 115, illustrating that BPSK signal 115 comprises RF carrier signal 15 at a frequency $F_C$ modulated by square wave signal 25 at a frequency $F_M$.

Figure 2:
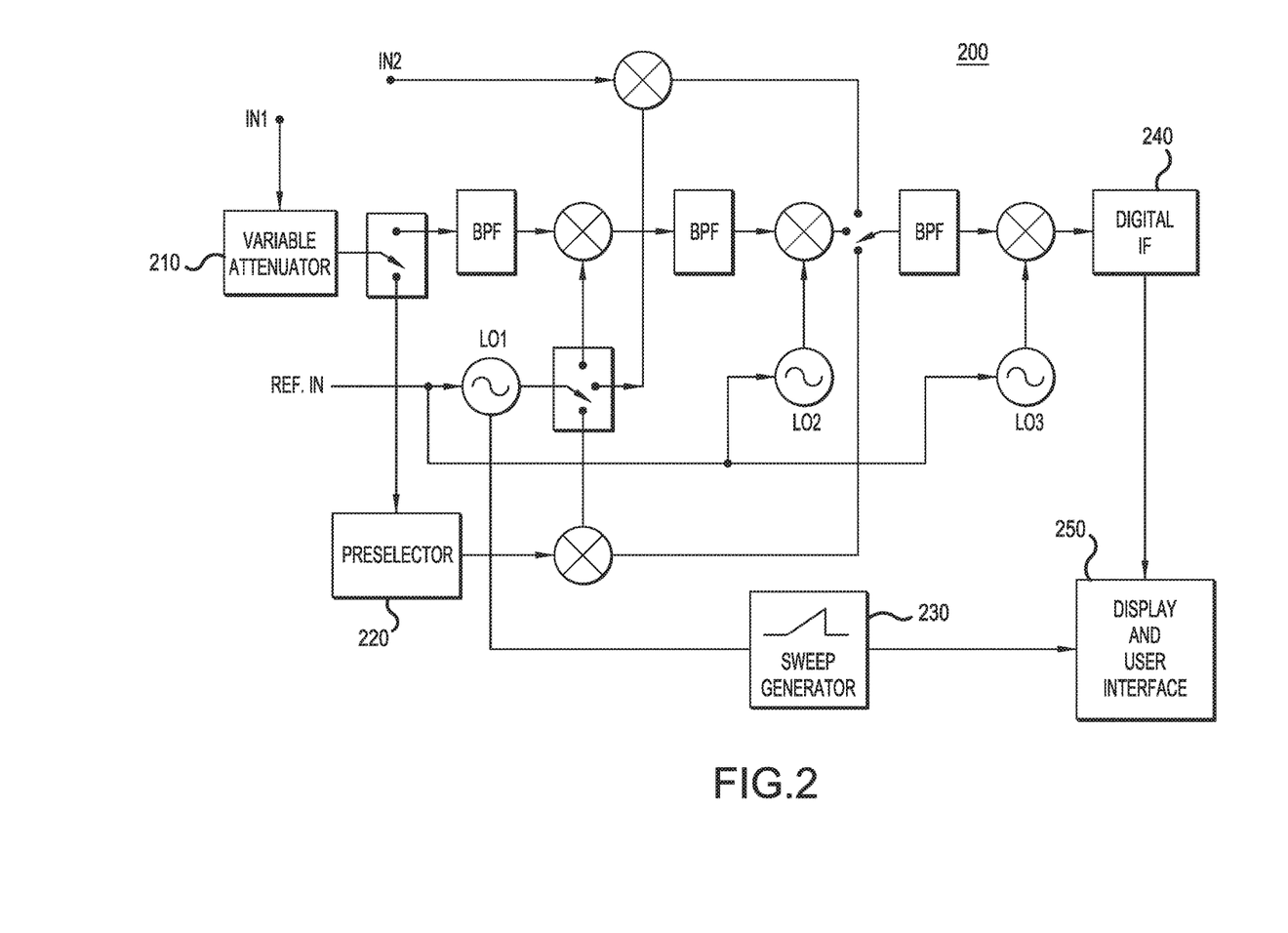
FIG. 2 is a simplified block diagram of an example of a spectrum analyzer.

To provide a more concrete example of a measurement instrument to which arrangement 1 may be applied, FIG. 2 is a simplified block diagram of an example of a spectrum analyzer 200. Therefore it should be understood that spectrum analyzer 200 may be one example of a measurement instrument with a signal processing channel whose amplitude and phase response as a function of frequency may be characterized by an arrangement such as the arrangement 1 of FIG. 1.

Spectrum analyzer 200 has two inputs IN1 and IN2, where IN1 may be configured to receive signals (e.g., RF and microwave signals) in lower frequency ranges, and IN2 may be configured to receive signals (e.g., millimeter wave signals) in higher frequency ranges. Spectrum analyzer 200 may include a variable attenuator 210 at input IN1. Spectrum analyzer 200 may also include a preselector, or variable RF filter, 220 at its input IN1 for rejecting signals which are outside a frequency band of interest so as to improve the performance of spectrum analyzer 200. Optionally, spectrum analyzer 200 may provide a user-selected operating mode where preselector 220 is bypassed.

Spectrum analyzer 200 includes a display and user interface 250. Spectrum analyzer 200 may display one or more characteristics or parameters of a received signal on the display in response to user inputs received via the user interface.

Spectrum analyzer 200 includes a plurality of frequency conversion stages all of which result in a received input signal being frequency converted to an intermediate frequency (IF) signal which is processed by a digital IF channel 240, as discussed in greater detail below. In particular, spectrum analyzer 200 includes a plurality of local oscillators LO1, LO2 and LO3 and associated mixers and bandpass filters (BPFs) for converting input signals over a wide range of frequencies to the IF frequency of digital IF channel 240. Each of the local oscillators LO1, LO2 and LO3 may be synchronized to common, stable, reference frequency signal (e.g., at 10 MHz) which may be provided by an internal reference oscillator or via a REFERENCE IN input. In some embodiments, whether the reference frequency signal is provided by the internal reference oscillator or via the REFERENCE IN input may be determined in response to a user selection via the user interface. Spectrum analyzer 200 may also include a sweep generator 230 which is connected to LO1 to sweep the frequency of LO1 across a desired span or frequency range which for which the input signal is to be measured by spectrum analyzer 200.

As noted above, spectrum analyzer 200 is only one example configuration of a spectrum analyzer, and many other configurations are possible. Furthermore, the general operation of a spectrum analyzer is well-known to those skilled in the art and therefore will not be explained here.

Figure 3:
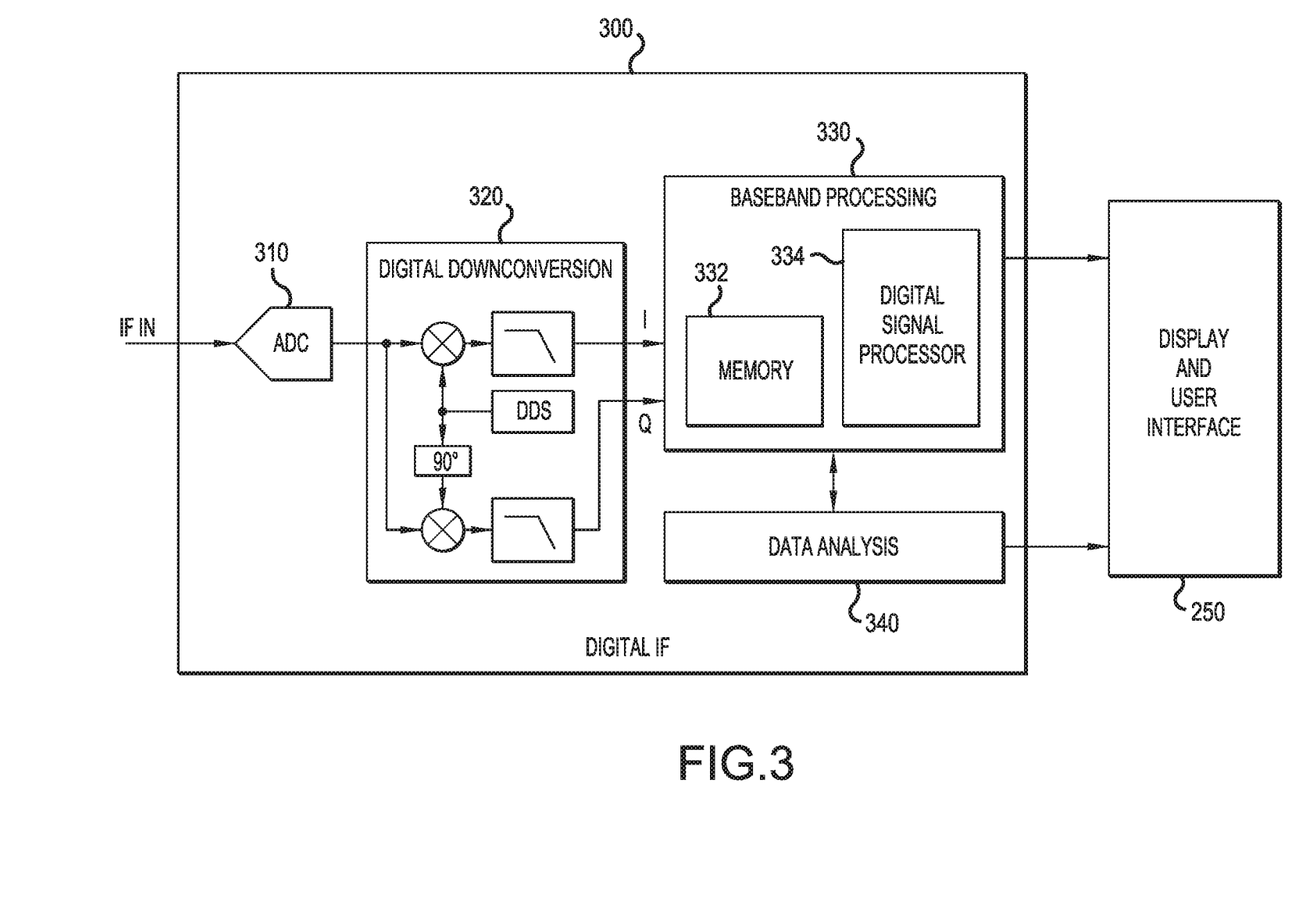
FIG. 3 illustrates an example embodiment of a digital intermediate frequency (IF) channel of a spectrum analyzer.

To provide a more concrete example of a digital IF channel 240 which may be included in a measurement instrument to which arrangement 1 may be applied, FIG. 3 illustrates an example embodiment of a digital intermediate frequency (IF) channel 300 of a spectrum analyzer such as spectrum analyzer 200. Therefore it should be understood that digital IF channel 240 may be one example of a portion of a signal processing channel whose amplitude and phase response as a function of frequency may be characterized by an arrangement such as the arrangement 1 of FIG. 1.

Digital IF channel 300 includes an analog-to-digital converter 310, a digital downconverter 320, a baseband processor 330, and a data analysis section 340.

ADC 310 receives an analog IF signal (e.g., produced from BPSK signal 115 by a measurement channel of spectrum analyzer 200), and digitizes the received analog IF signal in the IF channel (e.g., in response to a clock (not shown)) to produce a digital IF signal as a series of I and Q data samples or time records.

Digital downconverter 320 receives the digital IF signal from ADC 310, and includes a direct digital synthesizer (DDS) providing in-phase (I) and quadrature-phase (Q) frequency signals to be mixed with the digital IF signal to produce I and Q data, or time records, of the digital IF signal (which, for example, may be produced from BPSK signal 115 by a measurement channel of spectrum analyzer 200). The I and Q time records may be stored in an acquisition memory 332 of baseband processor 330 and may be processed by a digital signal processor 334 of baseband processor 330, as discussed in greater detail below. Digital signal processor 334 may include any combination of digital logic, application specific integrated circuit(s) (ASICS), firmware, microprocessor(s), and/or executable code.

Data analysis section 340 may analyze the I and Q time records to generate various statistics (e.g., peak value, average value, etc.) which may be displayed by the display of display and user interface 250, as is known by those skilled in the art.

Turning back to FIG. 2, beneficially XOR gate 110 may be driven into saturation by the strength of the RF carrier signal 15 and square wave signal 25, and may exhibit a high gain such that BPSK signal 115 has very fast edges, approaching an ideal waveform. In the frequency domain, BPSK signal 115 can be considered as a comb signal where the relative amplitudes and phases of the tones or "comb teeth" are defined by the nature of the BPSK signal, and are therefore well known. Thus BPSK signal 115 may be an advantageous probe or test signal for use in measuring the amplitude and phase response of a signal processing channel, such as a measurement channel of measurement instrument 100. Details of such measurements will now be described.

Figure 4:
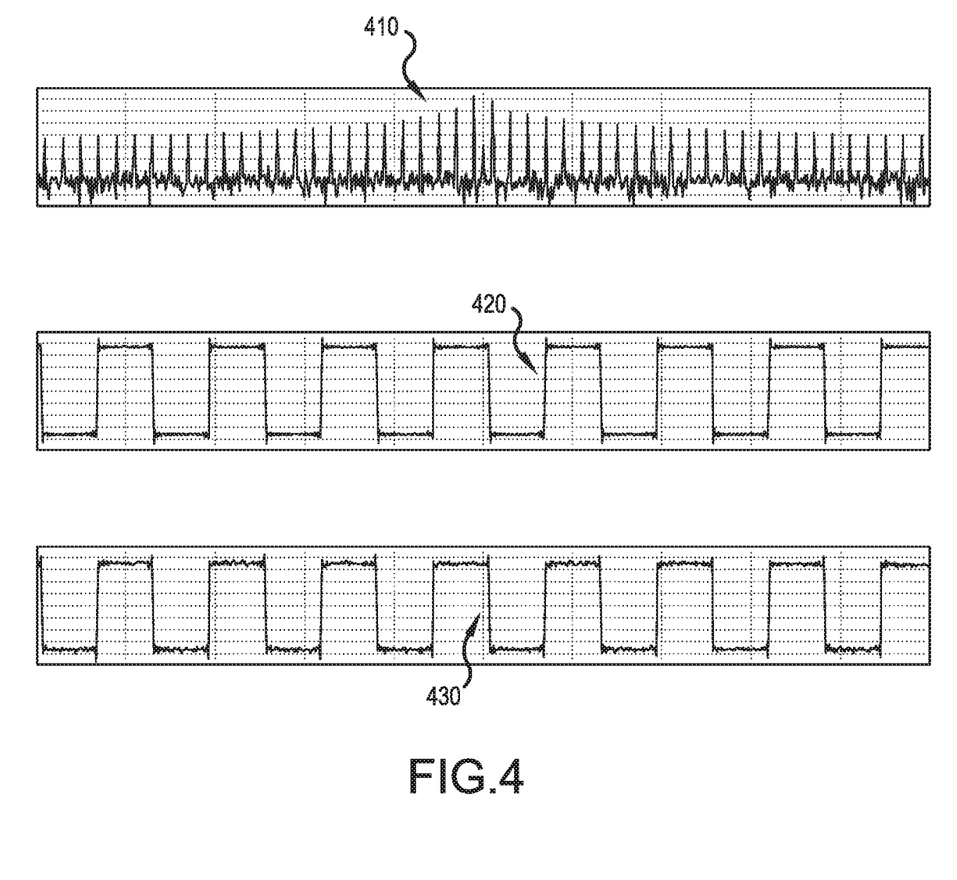
FIG. 4 shows some example waveforms produced by a measurement instrument in response to a BPSK signal.

FIG. 4 shows some example waveforms produced by a measurement instrument, for example a vector signal analyzer (VSA), in response to BPSK signal 115.

Waveform 410 is an example waveform of BPSK signal 115 at a center frequency $F_C$ of 10.25 GHz and a square wave modulation rate $F_M$ of 2.5 MHz. Waveforms 420 and 430 show the time domain record of the In-phase (I) and Quadrature (Q) components respectively, of the BPSK signal output by the signal processing channel ("the channel"), with the phase alternating between +90 and −90 degrees with a 50% duty cycle.

From a single capture of the I and Q time domain components of the BPSK signal output by the signal processing channel, the channel frequency response (amplitude and phase) can be measured or calculated using the following process.

First, the channel impulse response by is obtained by taking the derivatives of the I and Q time records using the finite difference method for example. In some embodiments, the derivatives of the I and Q time records may be taken by a digital signal processor, such as digital signal processor 334 of FIG. 3.

Next, the highest impulse in I and Q time records is found and the time records are circularly rotated so that this point is at time zero. This aligns the delay of the time response so that no hardware triggering is required between the modulation source (e.g., square wave signal generator 20) and the receiver (e.g., digital IF channel 300). In some embodiments, the highest impulse in I and Q time records may be found and the time records may be circularly rotated by a digital signal processor, such as digital signal processor 334 of FIG. 3.

Next, a Fourier transform (e.g., a fast Fourier transform (FFT)) is performed on the circularly rotated I and Q time records. Only FFT data at frequencies and harmonics of the square wave frequency are retained to get the frequency response (amplitude and phase) of the channel. In some embodiments, the FFT may be performed by a digital signal processor, such as digital signal processor 334 of FIG. 3.

Next, the amplitude response of the channel as a function of frequency, obtained above via the Fourier transform, is corrected for the known sin(x)/x roll-off caused by the zero-order hold characteristic of the square-wave modulation in the XOR gate. That is, the amplitude data obtained by the Fourier transform may be multiplied by an inverse function of the known sin(x)/x rolloff. This provides the amplitude response of the channel (e.g., a measurement channel of a measurement instrument) as a function of frequency. In some embodiments, the correction may be performed by a digital signal processor, such as digital signal processor 334 of FIG. 3.

Now, an explanation is provided as to how the channel phase response is obtained from the earlier-obtained Fourier transformed I and Q time records.

First, the phase data is "unwrapped" across the measured frequency span. That is, the phase data exhibits "jumps" across 180° phase angles. Unwrapping the phase data means correcting the phase data so that there are no +180°/−180° steps in the phase data. In some embodiments, the phase data may be unwrapped by a digital signal processor, such as digital signal processor 334 of FIG. 3.

Next, the derivative of the unwrapped phase data is taken and the resultant data, is normalized to remove any residual group delay offset and thereby obtain a group delay response of the channel. In some embodiments, the derivative of the unwrapped phase data may be obtained, and any residual group delay offset may be removed, by a digital signal processor, such as digital signal processor 334 of FIG. 3.

Finally, the group delay response is integrated to obtain the channel phase response (e.g., the phase response of a measurement channel of a measurement instrument) as a function of frequency.

Figure 5:
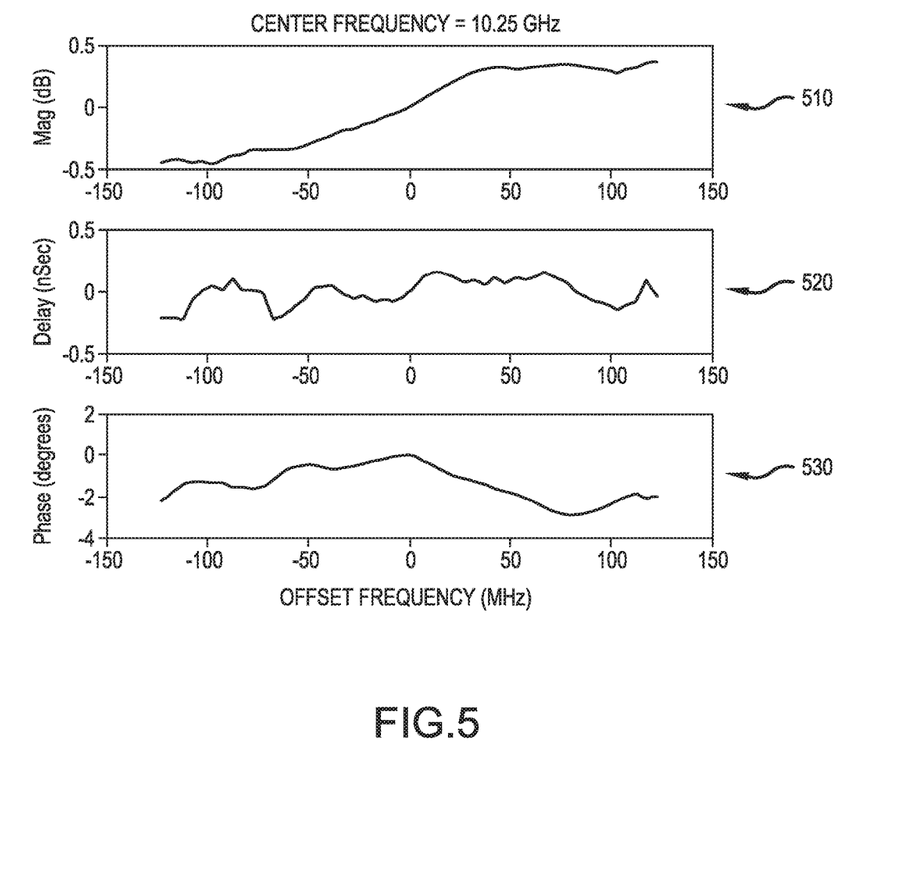
FIG. 5 illustrates example plots of the amplitude response, group delay response, and phase response of a signal processing channel of a measurement instrument, measured using a BPSK test signal.

FIG. 5 illustrates example plots of the amplitude response 510, group delay response 520, and phase response 520 of an example signal processing channel (e.g., signal processing channel 120) of a measurement instrument (e.g., a spectrum analyzer), measured using a BPSK test signal (e.g., BPSK signal 115), as described above. In some embodiments, one or all of the plots 510, 520 and 530 may be displayed by a measurement instrument (e.g., measurement instrument 100 and/or spectrum analyzer 200) on a display device (e.g., display device 140 and/or display and user interface 250).

In some contexts, the repeatability of amplitude response 510 may be less than desired. For example, in a case where the signal processing channel 120 being measured is a measurement channel of a spectrum analyzer, and the spectrum analyzer is operating in preselector bypass mode (as described above with respect to spectrum analyzer 200), images of the out-of-span harmonics of the received BPSK signal 115 may wrap around and fall on top of the tones of interest in BPSK signal 115, and therefore may appear in the Fourier transform data described above. Random phasing of the images with respect to the tones of interest may cause amplitude variations which degrade measurement repeatability.

Accordingly, in some embodiments the center frequency of the measurement channel of the measurement instrument may be offset or shifted with respect to the RF carrier frequency $F_C$ by a fraction of the square wave frequency $F_M$, wherein the fraction is greater than zero and less than one, so as to move the images so that they no longer fall on the tones of interest.

Figure 6:
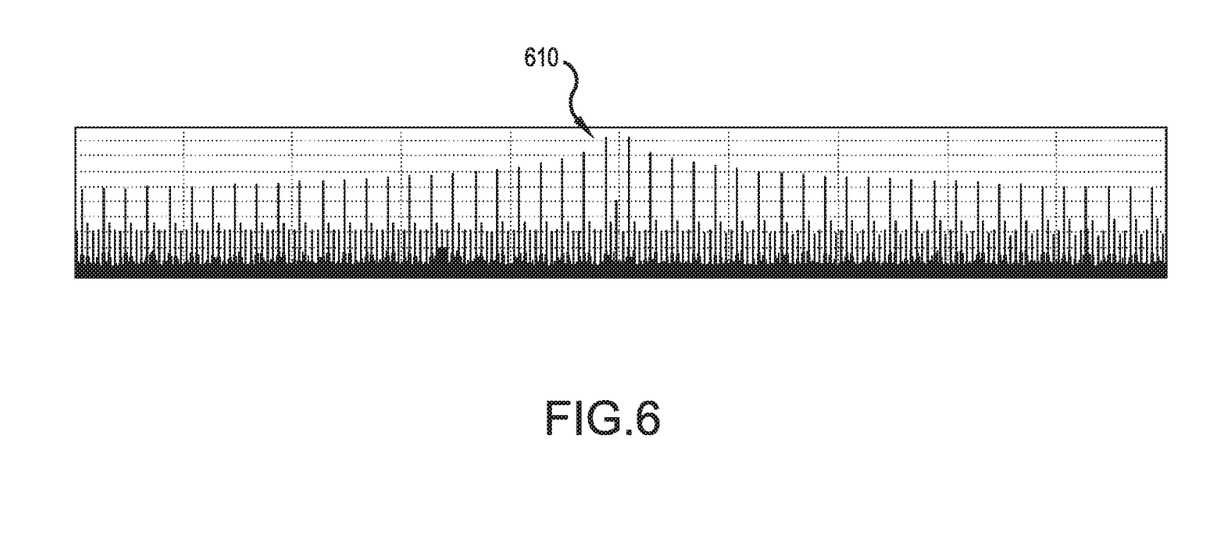
FIG. 6 illustrates a frequency spectrum of a BPSK signal, shifted in frequency with respect to the center of a measurement channel.

FIG. 6 illustrates the frequency spectrum 610 of a BPSK signal (e.g., BPSK signal 115) in an example where the center frequency of the measurement channel of the measurement instrument (e.g., a spectrum analyzer) has been offset of shifted with respect to the RF carrier frequency $F_C$ by a fraction of the square wave frequency $F_M$. In the example illustrated in FIG. 6, the center frequency of the measurement channel of the measurement instrument (e.g., a spectrum analyzer) has been offset or shifted with respect to the RF carrier frequency $F_C$ by $F_M/4$ (i.e., the fraction of the square wave frequency $F_M$ is one quarter of the square wave frequency $F_M$). Accordingly, the images of the out-of-span harmonics of the received BPSK signal 115 fall in between the desired tones of BPSK signal 115, and are essentially discarded once the Fourier transform is performed as described above.

With the frequency spectrum shifted by a fraction of the square wave frequency (e.g., by $+F_M/4$), then the I and Q time records are rotated by an opposite of the fraction of the square wave frequency (i.e., by $-F_M/4$) prior to taking the derivatives of the I and Q time records, as described above.

Figure 7A:
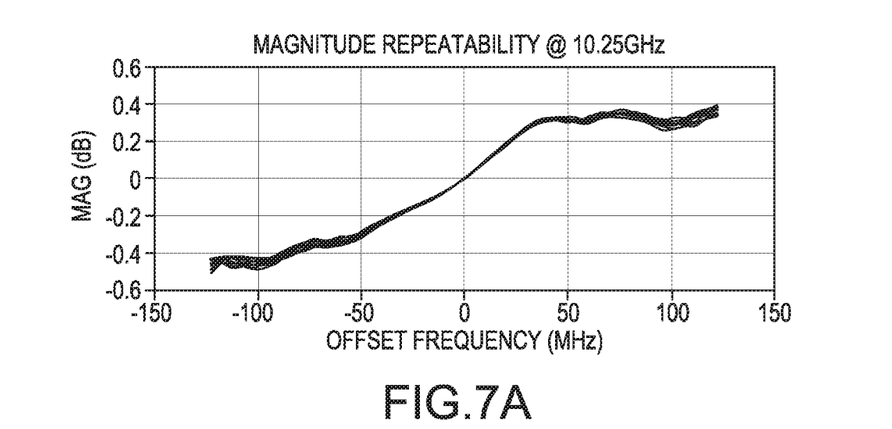
Figure 7B:
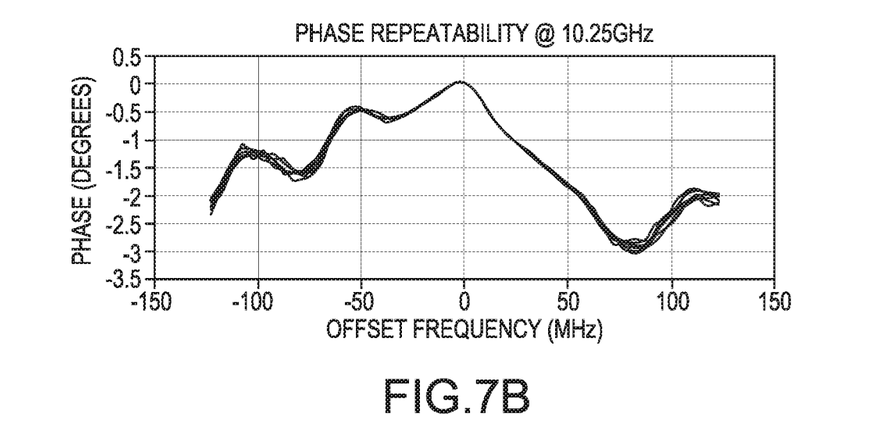
FIG. 7B illustrates repeatability of phase linearity measurements, for an example signal processing channel according to an example embodiment of a method of characterizing the amplitude and phased response of the signal processing channel as a function of frequency.

FIG. 7A illustrates repeatability of amplitude linearity measurements, and FIG. 7B illustrates repeatability of phase linearity measurements, for an example signal processing channel when the center frequency of the channel is offset with respect to the tone of the BPSK signal as described above.

Figure 8:
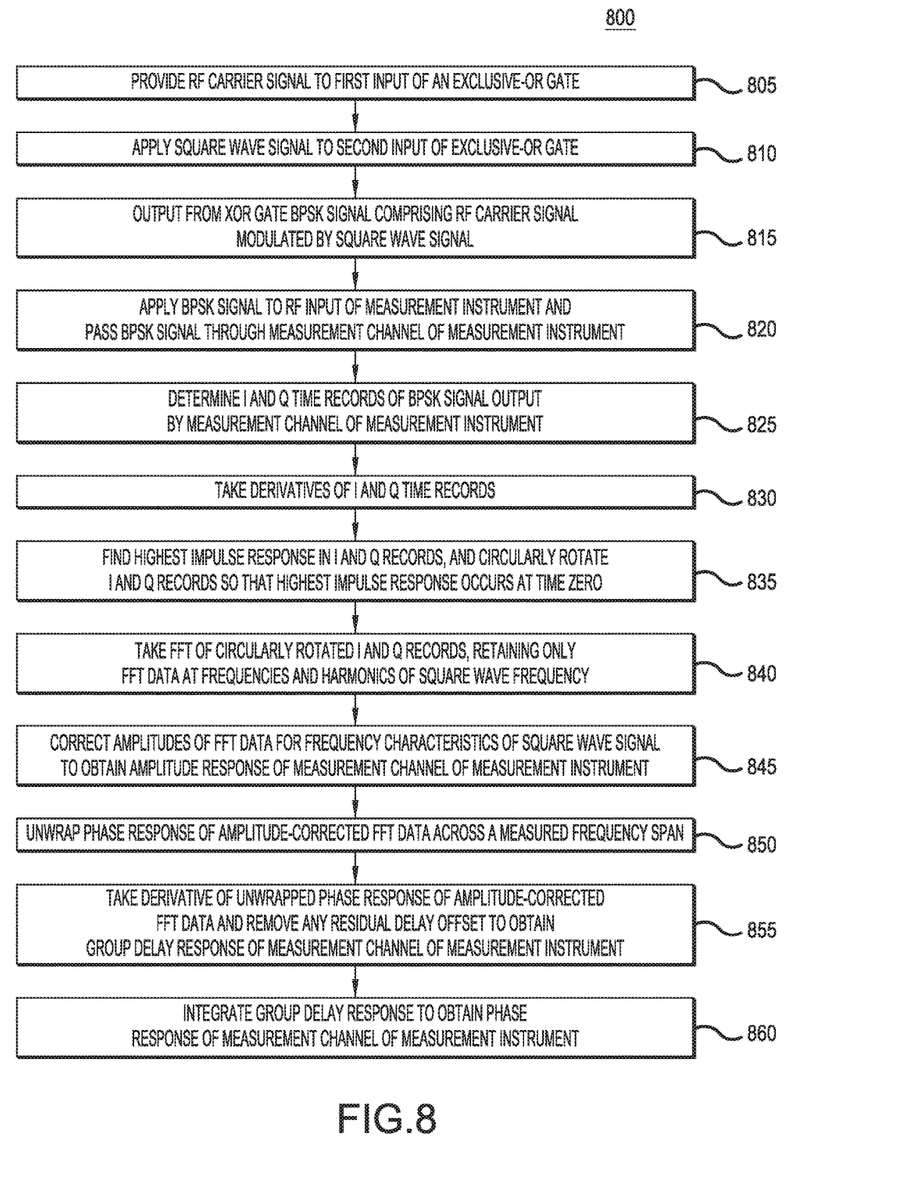
FIG. 8 is a flowchart of an example embodiment of a method of characterizing the amplitude and phase linearity of a signal processing channel as a function of frequency.

FIG. 8 is a flowchart of an example embodiment of a method 800 of characterizing the amplitude and phase linearity of a signal processing channel as a function of frequency, as described above.

An operation 805 includes providing an RF carrier signal having an RF carrier frequency to a first input of an exclusive-OR gate.

An operation 810 includes applying a square wave signal having a square wave frequency to a second input of the exclusive-OR gate.

An operation 815 includes outputting from the exclusive-OR gate a binary phase shift keying (BPSK) signal comprising the RF carrier signal modulated by the square wave signal.

An operation 820 includes applying the BPSK signal to an RF input of a measurement instrument and passing the BPSK signal through a measurement channel of the measurement instrument.

An operation 825 includes determining in the measurement instrument in-phase (I) and quadrature-phase (Q) time records of the BPSK signal output by the measurement channel of the measurement instrument.

An operation 830 includes taking derivatives of the I and Q time records.

An operation 835 includes finding a highest impulse response in the I and Q time records, and circularly rotating the I and Q time records so that the highest impulse response occurs at time zero.

An operation 840 includes taking a Fast Fourier Transform (FFT) of the circularly rotated I and Q time records, retaining only FFT data at frequencies and harmonics of the square wave frequency.

An operation 845 includes correcting amplitudes of the FFT data for a frequency characteristic of the square wave signal to obtain an amplitude response of the measurement channel of the measurement instrument.

An operation 850 includes unwrapping a phase response of the amplitude-corrected FFT data across a measured frequency span.

An operation 855 includes taking a derivative of the unwrapped phase response of the amplitude-corrected FFT data and removing any residual group delay offset to obtain a group delay response of the measurement channel of the measurement instrument.

An operation 860 includes integrating the group delay response to obtain a phase response of the measurement channel of the measurement instrument.

While example embodiments are disclosed herein, one of ordinary skill in the art appreciates that many variations that are in accordance with the present teachings are possible and remain within the scope of the appended claims. For example, the number of square wave cycles of the BPSK signal which are measured may be increased to improve the signal-to-noise ratio of the amplitude and phase linearity measurements through averaging. The invention therefore is not to be restricted except within the scope of the appended claims.

The invention claimed is:

1. A method, comprising:
providing an RF carrier signal having an RF carrier frequency to a first input of an exclusive-OR gate;
applying a square wave signal having a square wave frequency to a second input of the exclusive-OR gate;
outputting from the exclusive-OR gate a binary phase shift keying (BPSK) signal comprising the RF carrier signal modulated by the square wave signal;
applying the BPSK signal to an RF input of a measurement instrument and passing the BPSK signal through a measurement channel of the measurement instrument;
determining in the measurement instrument in-phase (I) and quadrature-phase (Q) time records of the BPSK signal output by the measurement channel of the measurement instrument;
taking derivatives of the I and Q time records;
finding a highest impulse response in the I and Q time records, and circularly rotating the I and Q time records so that the highest impulse response occurs at time zero;
taking a Fast Fourier Transform (FFT) of the circularly rotated I and Q time records, retaining only FFT data at frequencies and harmonics of the square wave frequency;
correcting amplitudes of the FFT data for a frequency characteristic of the square wave signal to obtain an amplitude response of the measurement channel of the measurement instrument;
unwrapping a phase response of the amplitude-corrected FFT data across a measured frequency span;
taking a derivative of the unwrapped phase response of the amplitude-corrected FFT data and removing any residual group delay offset to obtain a group delay response of the measurement channel of the measurement instrument; and
integrating the group delay response to obtain a phase response of the measurement channel of the measurement instrument.

2. The method of claim 1, further comprising:
offsetting a center frequency of the measurement channel of the measurement instrument by a fraction of the square wave frequency, wherein the fraction is greater than zero and less than one; and
frequency rotating the I and Q time records by an opposite of the fraction of the square wave frequency prior to taking the derivatives of the I and Q time records.

3. The method of claim 2, wherein the fraction of the square wave frequency is one quarter of the square wave frequency.

4. The method of claim 1, further comprising displaying on a display device at least one of: the amplitude response of the measurement channel of the measurement instrument, the group delay response of the measurement channel of the measurement instrument, and the phase response of the measurement channel of the measurement instrument.

5. The method of claim 1, further comprising displaying on a display device the amplitude response of the measurement channel of the measurement instrument, the group delay response of the measurement channel of the measurement instrument, and the phase response of the measurement channel of the measurement instrument.

6. The method of claim 1, wherein the RF carrier signal and square wave signal are provided to the exclusive-OR gate, and the exclusive-OR gate modulates the RF carrier signal with the square wave signal, internally to the measurement instrument.

7. The method of claim 6, wherein the measurement instrument is a vector signal analyzer.

8. The method of claim 1, wherein passing the BPSK signal through the measurement channel of the measurement instrument includes:
   downconverting the BPSK signal to an intermediate frequency (IF) channel; and
   digitizing the IF channel to produce the I and Q time records.

9. A system, comprising:
   an exclusive-OR gate having: a first input configured to receive an RF carrier signal having an RF carrier frequency, a second input configured to receive a square wave signal having a square wave frequency, and an output configured to output a binary phase shift keying (BPSK) signal comprising the RF carrier signal modulated by the square wave signal;
   a measurement channel having an input and an output, wherein the input is connected to receive the BPSK signal, and wherein the measurement channel is configured to provide at the output in-phase (I) and quadrature-phase (Q) time records of the BPSK signal;
   an acquisition memory configured to receive and to store therein the I and Q time records; and
   a digital signal processor configured to:
      take derivatives of the I and Q time records;
      find a highest impulse response in the I and Q time records, and circularly rotate the I and Q time records so that the highest impulse response occurs at time zero;
      take a Fast Fourier Transform of the circularly rotated I and Q time records, retaining only FFT data at frequencies and harmonics of the square wave frequency;
      correct amplitudes of the FFT data for a frequency characteristic of the square wave signal to obtain an amplitude response of the measurement channel of the measurement instrument;
      unwrap a phase response of the amplitude-corrected FFT data across a measured frequency span;
      take a derivative of the unwrapped phase response of the amplitude-corrected FFT data and removing any residual group delay offset to obtain a group delay response of the measurement channel of the measurement instrument; and
      integrate the group delay response to obtain a phase response of the measurement channel.

10. The system of claim 9, wherein the digital signal processor includes a digital microprocessor and memory having stored therein instructions to cause the microprocessor to process the I and Q time records to obtain the phase response of the measurement channel.

11. The system of claim 9, wherein the digital signal processor is further configured to:
   offset a center frequency of the measurement channel by a fraction of the square wave frequency, wherein the fraction is greater than zero and less than one; and
   frequency rotate the I and Q time records by an opposite of the fraction of the square wave frequency prior to taking the derivatives of the I and Q time records.

12. The system of claim 11, wherein the fraction of the square wave frequency is one quarter of the square wave frequency.

13. The system of claim 9, further comprising a display device configured to display at least one of: the amplitude response of the measurement channel of the measurement instrument, the group delay response of the measurement channel of the measurement instrument, and the phase response of the measurement channel of the measurement instrument.

14. The system of claim 9, further comprising a display device configured to display the amplitude response of the measurement channel of the measurement instrument, the group delay response of the measurement channel of the measurement instrument, and the phase response of the measurement channel of the measurement instrument.

15. The system of claim 9, wherein the system comprises a vector signal analyzer.

16. The system of claim 9, wherein the measurement channel includes:
   a downconverter configured to downconvert the BPSK signal to an intermediate frequency (IF) channel; and
   a digitizer configured to digitize the IF channel to produce the I and Q time records.

17. A system, comprising:
   an exclusive-OR gate having: a first input configured to receive an RF carrier signal having an RF carrier, a second input configured to receive a square wave signal having a square wave frequency, and an output configured to output to a signal processing channel under test a binary phase shift keying (BPSK) signal comprising the RF carrier signal modulated by the square wave signal; and
   a digital signal processor configured to receive from the signal processing channel in-phase (I) and quadrature-phase (Q) data produced by the signal processing channel in response to the BPSK signal, and to process the I and Q data to determine an amplitude response and phase response of the signal processing channel as a function of frequency, wherein the digital signal processor is further configured to:
   offset a center frequency of the measurement channel by a quarter of the square wave frequency; and
   frequency rotate the I and Q time records by an opposite of the quarter of the square wave frequency prior to taking the derivatives of the I and Q time records.

18. The system of claim 17, wherein the digital signal processor is configured to process the I and Q data by:
   taking derivatives of the I and Q data as a function of time;
   finding a highest impulse response in the I and Q data, and circularly rotate the I and Q data so that the highest impulse response occurs at time zero;
   taking a Fourier Transform of the circularly rotated I and Q time records to produce frequency domain data, retaining only frequency domain data at frequencies and harmonics of the square wave frequency;
   correcting amplitudes of the frequency domain data for a frequency characteristic of the square wave signal to obtain an amplitude response of the signal processing channel;
   unwrapping a phase response of the amplitude-corrected frequency data across a measured frequency span;
   taking a derivative of the unwrapped phase response of the amplitude-corrected frequency domain data and removing any residual group delay offset to obtain a group delay response of the signal processing channel; and integrating the group delay response to obtain a phase response of the signal processing channel.

19. The system of claim 17, further comprising a display device configured to display at least one of: the amplitude response of the measurement channel of the measurement instrument, the group delay response of the measurement channel of the measurement instrument, and the phase response of the measurement channel of the measurement instrument.

\* \* \* \* \*